INVENTOR
DAVID E. KENYON
BY
Herbert H. Thompson
his ATTORNEY.

Jan. 15, 1957 D. E. KENYON 2,777,968

TUNING MECHANISM FOR MICROWAVE RESONATOR ELECTRON TUBES

Filed July 14, 1952 2 Sheets-Sheet 2

INVENTOR
DAVID E. KENYON
BY
Herbert H. Thompson
his ATTORNEY.

Patented Jan. 15, 1957

2,777,968

TUNING MECHANISM FOR MICROWAVE RESONATOR ELECTRON TUBES

David E. Kenyon, Cold Spring Harbor, N. Y., assignor to Sperry Rand Corporation, a corporation of Delaware Application July 14, 1952, Serial No. 298,861

13 Claims. (Cl. 315—5)

The present invention relates to a highly sensitive tuning mechanism, and is particularly concerned with improved apparatus for moving capacitive tuning elements in very small microwave resonator electron tubes.

A convenient and often used method of tuning a resonator in a klystron, for example, is by varying the width of the electron permeable resonator gap therein. This is effected by changing the position of one of the gap-defining elements with respect to the other to vary the resonator capacitance.

Some klystron resonators have been designed to be operable over a frequency band of 33,000 to 36,000 megacycles per second. A resonator for such a frequency range must be very small, and it is required that only two thousandths (.002) of an inch change in the width of the resonator gap therein be made to effect tuning over the aforementioned frequency band. It is also required that the tuning mechanism be adjustable to such a fine degree that the resonator can be varied in operating frequency by as little as five megacycles. This represents about three micro-inches of change in spacing between the resonator gap defining elements.

A further desirable objective, when tuning resonators in the aforementioned manner, is the attainment of a linear resonator tuning response. This means that a constant degree of movement of the adjusting means of the tuner mechanism should result in a nearly linear change in resonator frequency. Such a change is approached, in accordance with the present invention, by providing mechanism for effecting a progressively variable displacement of the capacitive tuning element comprising one of the gap defining elements of the resonator. This displacement is in the proper sense to aid in compensating for the inherent non-uniform change in capacity between capacitive elements when the spacing therebetween is varied by a constant amount.

It is an object of this invention to provide an improved high frequency resonator tuning mechanism having an extremely fine micrometer adjustment with a minimum of backlash and a high degree of tuning sensitivity.

A further object of this invention is to provide a high frequency resonator tuner mechanism, which, over a predetermined range of resonator operating frequencies, will provide variable displacement of the resonator tuning element with a constant degree of variation of the tuner adjusting means, and in the sense toward compensation for changes in resonator tuning sensitivity.

Other objects and advantages of this invention will become apparent from the following specification, taken in connection with the accompanying drawings, wherein the invention is embodied in concrete form.

According to the present invention, an improved highly sensitive tuning mechanism is provided by employing a special arrangement of two levers. One lever, which is a cantilever, supports a movable capacitive tuning element of a very small microwave resonator. A second lever is supported near one of its ends between pivot means and a bearing means. The pivot means is supported in a fixed position relative to the resonator. The bearing means is supported on the second lever and movably contacts a region near the free end of the cantilever, variably depressing it as the second lever is moved about the pivot means. An adjusting means is employed to provide a displacement force at a region on the second lever an appreciable distance from said pivot means.

With the pivotal support and the bearing means positioned as shown with respect to each other and the cantilever, a constant variation of the adjusting means of the tuner mechanism in either of two directions will cause a progressively variable displacement of the capacitive tuning element in the proper sense to obtain a more linear resonator tuning response. By providing a proper degree of leverage through the levers, an extremely fine adjustment of the tuning element can be effected.

In the accompanying drawings.

Figure 1:
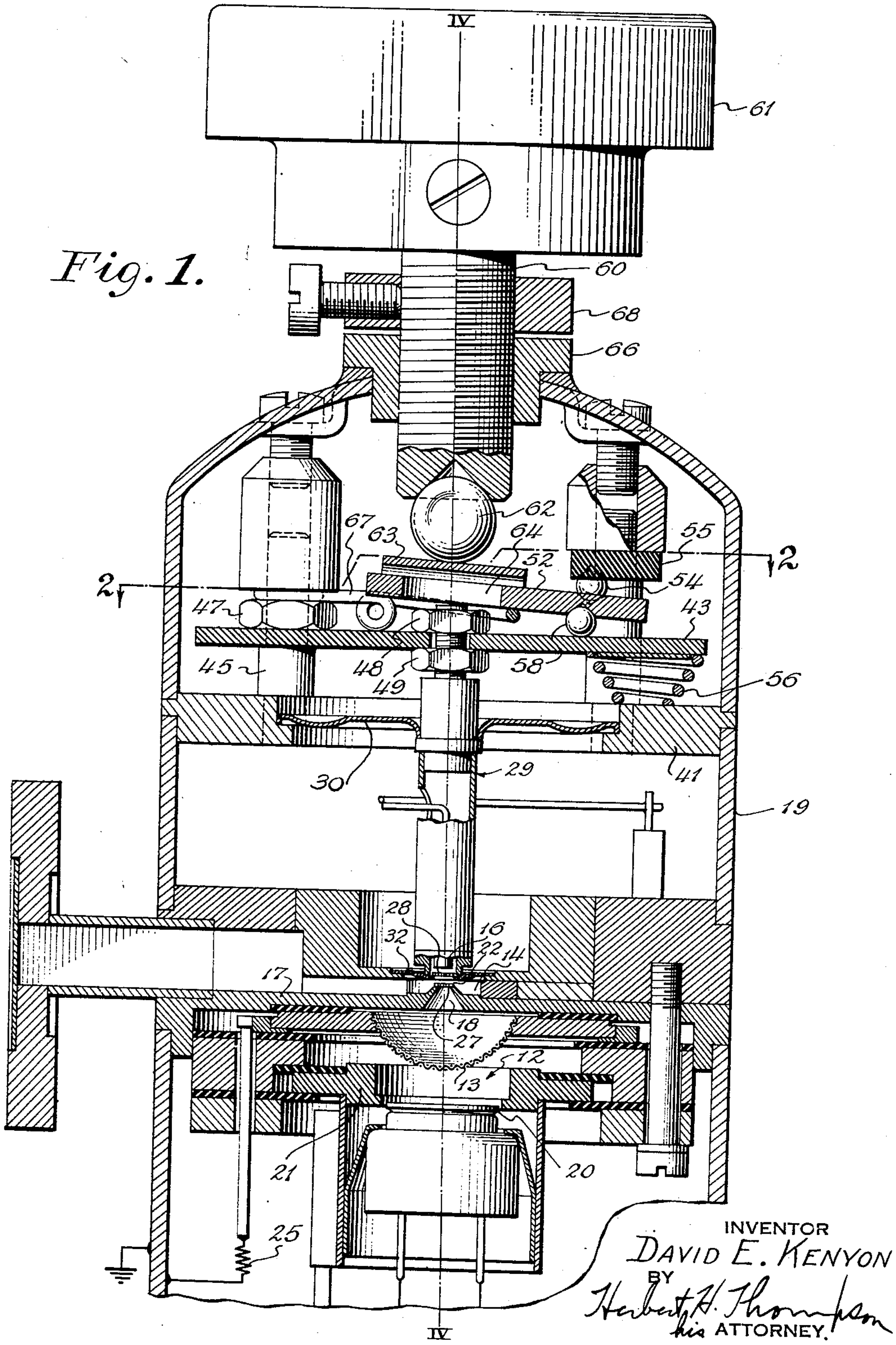
Fig. 1 is an enlarged sectional view of a reflex klystron embodying the tuner mechanism of the present invention.

Referring to Fig. 1, the reflex klystron shown comprises an electron gun structure 12, a smoother grid 13, a microwave resonator 14, and a reflector electrode 16. Ring member 17, which includes a conical opening 18 for passage of an electron beam, defines an anode plane for the klystron. All of the aforementioned elements are substantially concentric with tube axis IV—IV, and are supported within an evacuated portion of a tubular metallic envelope 19, ring member 41 and diaphragm 30 comprising vacuum-tight partition means for this portion.

The electron gun structure 12 comprises a cathode 20, the emissive surface thereof being concave and similar to the interior of a portion of a hollow sphere, and a focusing ring 21. The electron gun structure 12 is adapted to produce a convergent electron beam which has a very small diameter in the region of the resonator gap 22.

The smoother grid 13 comprises a spherically shaped mesh of extremely fine wires, the center of curvature of the sphere being substantially coincident with the center of curvature of the cathode 20. Smoother grid 13 is electrically insulated from both the ring member 17 and the electron gun structure 12. By connecting the smoother grid to a dropping resistor 25, which in turn is grounded to the tubular envelope 19, the smoother grid is maintained at a negative direct current potential with respect to the potential at the anode plane of the klystron. By employing a resistor of a proper value, undesired changes in focusing of the electron beam because of ions in the vicinity between the smoother grid and anode plane may be nullified. This insures that maximum beam transmission efficiency and power output is obtainable from extremely small klystrons of the type shown. The operations of the aforementioned smoother grid 14 and the dropping resistor 25 are more completely described in copending application No. 309,250, filed September 12, 1952 by the same inventor and assigned to the same assignee as the present application.

Figure 3:
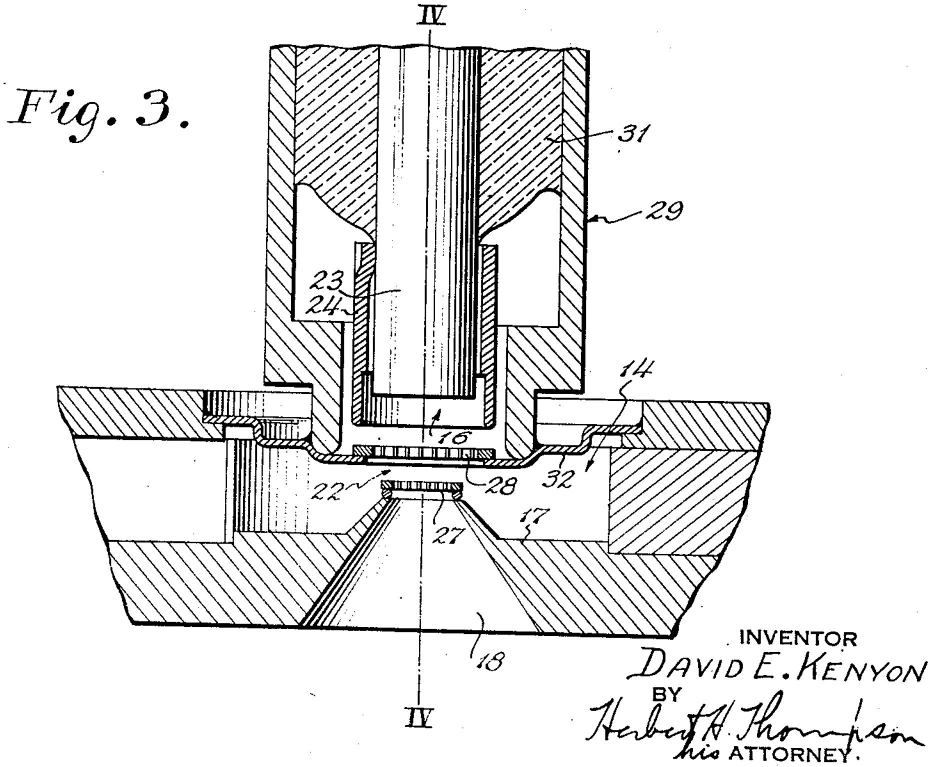
Fig. 3 is a greatly enlarged sectional view of the resonator and reflector electrode of the klystron shown in Fig. 1.

Referring to Fig. 3, which is an enlarged view of a portion of the klystron of Fig. 1, reflector electrode 16 comprises an end surface of rod 23 and a concentric sleeve member 24. Reflector electrode 16 is supported in axial alignment with the entrance and exit grids 27 and 28, respectively, of the cavity resonator 14, by means of a tubular actuating member 29, which in turn is axially supported by diaphragms 30 and 32. Dielectric element 31 fixedly supports the reflector electrode within member 29.

The entrance grid 27 of resonator 14 is mounted on the top of the small end of conical opening 18 in ring member 17. Exit grid 28 is supported by diaphragm 32. A portion of ring member 17 defines the bottom wall of the resonator 14 and diaphragm 32 constitutes the upper wall thereof. Diaphragm 32 is flexible in order that the intergrid spacing between the entrance and exit grids 27 and 28, respectively, may be varied by axially adjusting tubular actuating member 29. The spacing between exit grid 28 and reflector electrode 16 remains fixed during such an adjustment.

The reflex klystron shown operates in a manner well known in the art. Klystrons of the above type are now being designed to be operable at extremely high frequencies, requiring very small resonators. Therefore, an ultra sensitive tuning mechanism is required in order to achieve optimum tuning results. This is apparent when it is considered that present design specifications of some of the aforedescribed tubes require the resonator gap 22 to be only three thousandths (.003) of an inch wide. The entrance and exit resonator grid elements of such a tube have an inner diameter of twenty-five thousandths (.025) and forty-five thousandths (.045) of an inch respectively. As is plainly evident, a very minute adjustment of the exit grid 28 with respect to entrance grid 27 causes an appreciable change in the frequency of the resonator 14.

Figure 2:
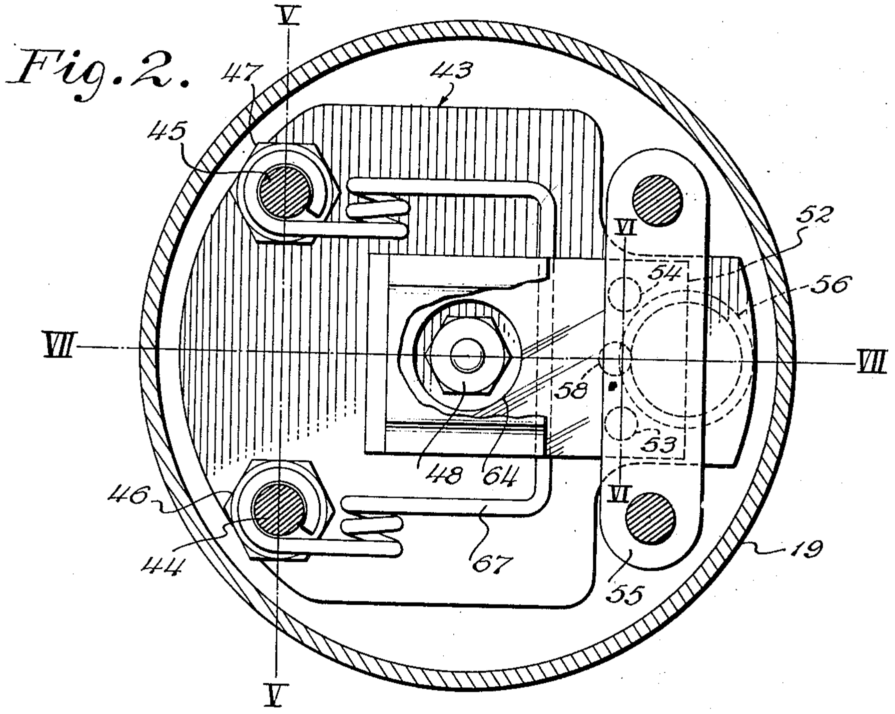
Fig. 2 is a cross sectional view of the klystron along the lines 2—2 of Fig. 1.

Referring to Figs. 1 and 2, the tuner mechanism comprises a flat cantilever 43 having two apertures therein along the V—V line (Fig. 2). The cantilever 43 is supported on seats provided on intermediate portions of members 44 and 45. Members 44 and 45 are each threaded at both ends, and are rigidly supported at one end by ring member 41. Nuts 46 and 47 maintain the cantilever in its proper place by clamping the cantilever against the seats on members 44 and 45, respectively. The cantilever 43 engages, through opposed nuts 48 and 49, the tuning element actuating member 29.

Supported above cantilever member 43 is a flat lever 52, which is held at one end between the top surface of the cantilever 43 and a pivotal supporting means comprising balls 53 and 54 and fixed support 55. The aforesaid balls rest in seats adjacent one end and on the top surface of lever 52, and are soldered in seats provided in the bottom surface of member 55. Supporting member 55 is rigidly supported by envelope 19 in the manner shown in the drawing. A line VI—VI (Fig. 2) extending through the centers of balls 53 and 54, is spaced from one end of lever 52, and is perpendicular to the axis VII—VII of the cantilever. The aforementioned line VI—VI constitutes the axis of rotation of lever member 52 with respect to the pivotal supporting means. A compressed coil spring 56 is employed to provide an upward force against the cantilever 43 to maintain the cantilever in engagement with a ball bearing means 58 situated between the upper surface of cantilever 43 and a recess in lever 52, and to maintain balls 53 and 54 firmly seated in positive engagement with lever 52 and member 55.

Bearing means 58, which comprises a ball member, rides on the smooth upper surface of cantilever 43 when the lever 52 is rotated around the axis VI—VI. Ball member 58 is soldered in a seat or recess in the bottom surface of lever 52.

A screw threaded tuner rod 60 having a tuner knob 61 thereon is provided at the top of the envelope 19 in a suitable threaded bushing 66. Soldered within a recess in the lower end of the tuner rod 60 is a large ball 62, for applying pressure to the lever 52. Lever 52 is provided with an elevated flat portion 63 to receive the aforesaid pressure, and an aperture 64 thereunder to provide clearance for nut 48 when the lever is in its extreme bottom position. Mouse trap spring 67 is employed to maintain an upward force against the lever 52 to maintain the flange member 63 in engagement with ball member 62.

In order to fix a lower limit of travel for lever 52, a stop collar 68 is provided on screw member 60 for engaging the upper surface of bushing 66. This sets the lower frequency limit of the klystron resonator and insures against the possibility of overtravel of the tuner knob 61 and possible consequent internal damage to the resonator elements.

The upper limiting position for lever 52 is reached when the right-hand end of lever 52 abuts the upper surface of cantilever 43.

The tuning mechanism shown in Fig. 1 is illustrated in a position which results in the klystron resonator being tuned to a frequency intermediate the upper and lower limits of its operating frequency range. Adjustment of tuner knob 61 to produce a downward displacement of screw 60 along the tube axis IV—IV, from the position shown in Fig. 1, results in counter-clockwise movement of lever 52 about the axis of rotation VI—VI through ball members 53 and 54. The foregoing movement of lever 52 causes ball member 58 to travel in an arc about the aforesaid axis of balls 53 and 54. This causes the cantilever 43 and the tuner actuating member 29 to move downward from the position shown. Movement of member 29 flexes the resonator diaphragm 32, moving the exit grid 28 (Fig. 3) closer to the entrance grid 27. The resulting decrease in resonator gap width and increase in capacity between the grids 27 and 28, lowers the resonant frequency of resonator 16 and the klystron tube.

When lever 52 is adjusted to its lowest limiting position (the farthest counter-clockwise movement thereof), ball member 58 should be very slightly displaced from a plane containing the axis VI—VI through ball members 53 and 54 and extending parallel to the axis IV—IV of the klystron tube.

As a result of the above arrangement, the adjustment of the lever 52 by tuner screw 60 will provide a variable degree of displacement of the resonator tuning element comprising exit grid 28 with a constant degree of adjustment of tuner knob 61 in either a clockwise or counterclockwise direction, i. e., a variable ratio of movement of the exit grid 28 to the movement of tuning screw 60. It will further provide that the aforementioned variation is in the proper sense to aid in compensation of the variable tuning sensitivity of the klystron resonator. This results from the movement of ball member 58. When lever 52 is moved in a counterclockwise direction the point of contact of ball member 58 with cantilever 43 approaches the aforementioned plane through ball members 53 and 54, the downward displacement of ball member 58 becoming progressively less with equal increments of adjustment of tuner knob 61. Also, the point of force applied to cantilever 43 by ball member 58 moves farther and farther away from the fixed end of the cantilever. Since the ball member 58 and the aforementioned point of force change as mentioned above, the downward displacement of tuner actuating member 29 becomes less and less with a given downward displacement of ball member 62. Hence the gap between grids 27 and 28 decreases at a progressively slower rate. Conversely, as the lever 52 is moved in a clockwise direction, the gap between grids 27 and 28 increases at a progressively faster rate with equal increments of adjustment of tuner knob 61.

In klystron resonators constructed to be operable over a frequency band of 33,000 to 36,000 megacycles per second, in accordance with what has been illustrated, only approximately two thousandths (.002) of an inch displacement of exit grid 28 is necessary to tune the klystron over the entire frequency band. By employing a dual-lever tuner mechanism in accordance with the present disclosure where the thread of tuner screw 60 has of the order of 40 turns per inch and by using a minimum leverage in the tuning mechanism of approximately 50 to 1, about four revolutions of the tuner screw is sufficient to cover the aforementioned range. Such a mechanism is settable to such a fine degree that the klystron can be changed in operating frequency by as little as five megacycles.

Ball bearing means 58 is shown as fixed in a seat in the bottom surface of lever 52 and rideable on the upper surface of cantilever 43. Balls 53 and 54 are shown as fixed in seats on the bottom surface of fixed member 55, the lever 52 being rotatable around the aforesaid balls. Obviously, substantially the same variable ratio of displacement of member 29 and grid 28 to movement of tuning screw 60 could be obtained by supporting ball bearing means on the upper surface of lever 52, to be rideable along the bottom surface of fixed member 55, and supporting the two balls in seats on the top surface of cantilever 43, so that lever 52 could be rotatable around such balls on the cantilever.

Since many other changes could be made in the above construction and many apparently widely different embodiments of this invention could be made without departing from the scope thereof, it is intended that all matter contained in the above description or shown in the accompanying drawings shall be interpreted as illustrative and not in a limiting sense.

I claim:

1. A high frequency electron tube, comprising an electron gun for producing and directing an electron beam along a predetermined axis, a target electrode spaced from said electron gun and mounted in alignment with said axis, a microwave resonator having an electron permeable entrance and exit grids spaced a short distance apart and positioned in alignment with said axis, said grids being positioned between said electron gun and said target electrode, said exit grid being mounted on a flexible diaphragm, said diaphragm forming a wall of said cavity resonator, a tubular actuating member enclosing and supporting said target electrode, means joining said actuating member to said flexible diaphragm, a cantilever, said cantilever being fixed in position at its supported end with respect to said resonator, means joining said tubular actuating member to an intermediate position on said cantilever, a lever spaced further from said resonator than said cantilever, pivotal means supporting said lever near one end of said lever, bearing means supported between and contacting adjacent sides of said cantilever and said lever near the free end of said cantilever and said one end of said lever, said bearing means being fixed against axial movement along said lever and movable along said cantilever, the axis of rotation of said lever with respect to said pivotal supporting means being fixed with respect to said resonator, said axis of rotation being spaced by a slightly greater distance from said electron tube axis than any point of contact of said bearing means in said region along said cantilever, tuner adjusting means for moving said lever about said axis of rotation, resilient means for maintaining said cantilever in engagement with said bearing means and in engagement with said tuning means, whereby adjustment of said tuner adjusting means cause displacement of said exit grid thereby changing the frequency of said resonator and the operating frequency of said electron tube, the displacement, of said exit grid effected by a constant degree of movement of said tuner adjusting means being progressively less as said exit grid is moved closer to said entrance grid and progressively greater as said grids are moved farther apart.

2. A high frequency electron beam tube structure, comprising a microwave resonator having first and second means defining an electron permeable gap along the beam axis of said electron tube, said first means being movable relative to said second means to change the width of said gap along said axis and thereby vary the tuning of said resonator, a tuning mechanism for effecting movement of said first gap defining means, said tuning mechanism comprising a first lever supported traversely to said beam axis, said first lever being supported on one side of said axis of said electron tube, means connecting said first gap defining means to an intermediate position between the ends of said first lever, a fixed pivotal support adjacent said first lever on the opposite side of said axis than said first mentioned side, said support being fixedly mounted with respect to said resonator and positioned on the opposite side of said first lever from said resonator, a second lever, means supporting said second lever between said fixed pivotal support and said first lever, said means comprising bearing means for spacing said lever from said first lever, said bearing means movably contacting said first lever over a region therealong on said opposite side of said axis, the axis of rotation of said second lever with respect to said fixed pivotal support being displaced from said beam axis by a slightly greater distance than any point in the region of contact of said bearing means with said cantilever.

3. A tuning mechanism for a high frequency microwave resonator, comprising a cantilever extending in a direction away from a fixed support, said cantilever including means for positioning a movable tuner element actuating member at a first region intermediate the supported and free ends of said cantilever, a lever having a first end adjacent the free end of said cantilever, pivotal support means contacting said lever at a first region relatively near said first lever end, bearing means supported on said lever at a second region on said lever, said bearing means contacting said cantilever at a position adjacent the free end thereof, said bearing means being movable along a region on said cantilever, resilient means for maintaining the free end of said cantilever against said bearing means and said lever against said pivotal support means, an adjusting means for applying a force to said lever at a region therealong spaced from said first region of pivotal support, resilient means for maintaining said lever against said adjusting means, the axis of rotation of said lever with respect to said pivotal support means being substantially perpendicular to said direction of extent of said cantilever, said axis being displaced at a first distance from a plane through said cantilever adjacent the supported end thereof and perpendicular to direction of extent of said cantilever, the distance from said plane to any position of contact of said bearing means with said cantilever being slightly less than said first distance, whereby constant increments of adjustment of said adjusting means in a first direction to move said first lever end away from said cantilever causes said first intermediate region of said cantilever to be displaced in a first direction by a progressively lesser amount, and constant increments of adjustment of said adjusting means in a second direction to move said first lever end towards said cantilever causes said first region intermediate said cantilever to be displaced in a second and opposite direction by a progressively greater amount.

4. A tuning mechanism for a high frequency microwave resonator tunable by changing the capacity between first and second closely spaced elements thereof, comprising, means connected to said first element for moving said element along a first axis extending through said second element, a first lever transverse to said first axis and supported with respect to a second axis substantially perpendicular to said first axis, said second axis being spaced from said first axis on one side thereof, pivot means on the opposite side of said first axis from said second axis, a second lever, means supporting said second lever between said first lever and said pivot means, said means comprising bearing means fixedly supported by said second lever, said bearing means contacting said first lever and movable over a region therealong, the axis of rotation of said second lever with respect to said pivot means being spaced a slightly greater distance from the axis of movement of said first capacitive element than any contact point in the region of movability of said bearing means along said first lever, whereby movement of said second lever causes the capacity between said first and second elements to progressively increase with a constant degree of movement of said lever in a first direction with respect to said pivot means and to progressively decrease with a constant degree of movement of said lever in the opposite direction with respect to said pivot means.

5. High-frequency tube apparatus, comprising a housing, means for producing an electron beam directed along a predetermined axis within said housing and substantially coaxial therewith, a hollow resonator rigidly mounted within said housing and having an axial beam passage therethrough aligned with said predetermined axis, a tuning screw supported in a wall of said housing and axially aligned with said predetermined axis, and means responsive to movement of said tuning screw along said axis for variably deflecting a portion of said resonator to vary the resonant frequency thereof, said last named means including a first lever situated within said housing transverse said predetermined axis, said first lever being mechanically coupled to said tuning screw to be actuated thereby, and means coupling said first lever to said resonator portion at a position of reduced motion of said first lever, said last-named means comprising a further motion reducing lever disposed transverse said predetermined axis within said housing between said first lever and said resonator.

6. High-frequency apparatus as defined in claim 5, further including vacuum-tight partition means transversely disposed in said housing for maintaining a vacuum-tight separation between the interior of said resonator and said tuning screw and levers.

7. High-frequency tube apparatus, comprising a housing, means for producing an electron beam directed along a predetermined axis within said housing, a hollow resonator rigidly mounted within said housing and having an axial beam passage therethrough aligned with said predetermined axis, said resonator including a deflectable portion for changing the frequency thereof, a tuning screw supported in a wall of said housing and axially aligned with said predetermined axis, a first lever situated within said housing transverse said predetermined axis, said first lever being mechanically coupled to said tuning screw to be actuated thereby, a further lever disposed transverse said predetermined axis within said housing between said first lever and said resonator, means coupling said further lever to said first lever at a position of reduced motion of said first lever, vacuum-tight partition means transversely disposed in said housing for maintaining a vacuum-tight separation between the interior of said resonator and said tuning screw and levers, said partition means comprising a first flexible diaphragm transversely disposed within said housing and symmetrical about said axis, a second flexible diaphragm transversely disposed within said housing and symmetrical about said axis, and rigid, longitudinally movable actuating means extending between and affixed to said first and said second flexible diaphragms, said last-named means being coupled to said further lever and said deflectable portion of said resonator for controlling the frequency of said resonator in response to movement of said tuning screw.

8. High frequency electron tube apparatus, comprising a housing, means for producing and directing an electron beam along a predetermined axis through said housing, a resonator supported in said housing and having an axial beam passage therethrough aligned with said predetermined axis, a tuning screw supported by and extending into said housing substantially parallel with said axis, a first lever situated in said housing transverse said predetermined axis, said first lever being mechanically coupled to said tuning screw to be actuated thereby, a further lever disposed transverse said axis between said first lever and said resonator, said further lever being coupled to said first lever at a position of reduced motion of said first lever, longitudinally movable actuating means coupled to said further lever at a position of reduced motion of said further lever, two flexible diaphragms transversely disposed in said housing, said diaphragms being symmetrical about said axis and spaced from each other, said actuating means extending between said two flexible diaphragms and coupled thereto for alignment with said axis, one of said diaphragms comprising a wall of said resonator, whereby movement of said first lever produced by adjustment of said tuning screw causes axial movement of said actuating means and a displacement of said resonator wall thereby varying the frequency of said resonator.

9. High frequency electron tube apparatus as set forth in claim 8, wherein said further lever comprising a cantilever.

10. A tuning mechanism for electronic apparatus, comprising displaceable tuning means, variable adjusting means for displacing said tuning means along a predetermined axis, first lever means transverse said axis and supported at a location displaced from said axis, support means adjacent one side of said first lever means near one end of said first lever means remote from said location, said support means being spaced from said first lever means, means coupling said tuning means to a region along said first lever means intermediate the ends thereof, second lever means having a portion thereof between said first lever means and said support means, first and second bearing means for spacing said second lever means from said first lever means and said second lever means from said support means, respectively, said first and second bearing means being located on opposite sides of said second lever means to be contiguous with said first lever means and said support means, respectively, the region of contiguousness of said first bearing means with said first lever means being displaced from said predetermined axis by a slightly different distance than the region of contiguousness of said second bearing means with said support means, said second lever means and one of said bearing means being rotatable with respect to the other of said bearing means for displacing said first lever means and said tuning means, and means coupling said adjusting means to said second lever means for producing rotation of said second lever means thereby providing a progressively variable displacement of said tuning means along said predetermined axis with constant increments of adjustment of said adjusting means.

11. High frequency electron discharge apparatus, comprising a housing, means for producing and directing an electron beam along a predetermined path within said housing, a hollow resonator having an axial beam passage therethrough aligned with said path, movable tuning means for said resonator, an adjustable tuning screw supported in said housing, and means responsive to movement of said tuning screw for variably deflecting said tuning means to vary the resonant frequency of said resonator, said last-named means including a first lever spaced from said resonator and supported in said housing transverse the axis of said tuning screw, fixed support means within said housing, a second lever situated in said housing adjacent and along said first lever, a region of said second lever lying between said support means and said first lever, first and second bearing means on opposite sides of said second lever at said region, one of said bearing means comprising a fulcrum for said second lever, said first lever being coupled to said second lever through said first bearing means, said second lever being coupled to said support means through said second bearing means, means coupling said tuning screw to said second lever for causing rotation thereof about said fulcrum, and means coupling said tuning means to an intermediate position of reduced motion on said first lever.

12. High-frequency tube apparatus, comprising a housing, electron gun means supported by said housing for producing and directing an electron beam along a predetermined axis within said housing, a hollow resonator rigidly mounted within said housing, said resonator including an axial beam passage therethrough including entrance and exit electron permeable grid elements defining a resonator gap along said axis, said resonator further including a flexible wall portion for supporting said exit grid element for relative axial displacement with respect to said entrance grid element, an actuating member substantially aligned with said axis and supported at one end by said flexible wall portion, a flexible diaphragm supported between said housing and said actuating member adjacent the other end thereof for maintaining said actuating member substantially coaxial with said axis, first and second motion-reducing levers supported within said housing transverse said axis at locations beyond said actuating member, and an adjustable tuning screw supported in a wall of said housing for displacing said actuating member through said levers to thereby change the spacing between said grid elements and the frequency of said resonator, said levers comprising means for displacing said actuating member at a reduced rate compared with the rate of displacement of said tuning screw.

13. High-frequency tube apparatus as set forth in claim 12, wherein said actuating member comprises a tubular structure supporting a reflector electrode therein for displacement with said exit grid element.

References Cited in the file of this patent

UNITED STATES PATENTS

| | | |
|---|---|---|
| 2,304,186 | Litton | Dec. 8, 1942 |
| 2,380,946 | Cooke et al. | Aug. 7, 1945 |
| 2,414,785 | Harrison et al. | Jan. 2, 1947 |
| 2,439,387 | Hansen et al. | Apr. 13, 1948 |
| 2,454,306 | Clifford et al. | Nov. 23, 1948 |
| 2,466,058 | Sorg | Apr. 5, 1949 |